(12) United States Patent
Hellberg

(10) Patent No.: US 7,274,255 B2
(45) Date of Patent: Sep. 25, 2007

(54) EFFICIENT GENERATION OF RADIO FREQUENCY CURRENTS

(75) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 44 days.

(21) Appl. No.: 10/518,238

(22) PCT Filed: Jun. 19, 2003

(86) PCT No.: PCT/SE03/01068

§ 371 (c)(1),
(2), (4) Date: Aug. 25, 2005

(87) PCT Pub. No.: WO04/001958

PCT Pub. Date: Dec. 31, 2003

(65) Prior Publication Data

US 2006/0049870 A1    Mar. 9, 2006

(30) Foreign Application Priority Data

Jun. 19, 2002 (SE) ................................. 0201908

(51) Int. Cl.
  *H03G 3/20* (2006.01)
(52) U.S. Cl. ........................ 330/136; 330/129
(58) Field of Classification Search ............... 330/129, 330/136, 285, 256, 149; 455/114.3; 375/296, 375/297
See application file for complete search history.

(56) References Cited

U.S. PATENT DOCUMENTS

| 5,757,229 | A | 5/1998 | Mitzlaff |
| 5,808,511 | A | 9/1998 | Kobayashi |
| 5,923,215 | A | 7/1999 | Hans |
| 6,028,477 | A | 2/2000 | Gentzler |
| 6,130,579 | A | 10/2000 | Iyer et al. |
| 6,445,247 | B1 * | 9/2002 | Walker ........................ 330/10 |
| 6,531,917 | B2 * | 3/2003 | Yamamoto et al. ......... 330/149 |
| 6,600,369 | B2 * | 7/2003 | Mitzlaff ...................... 330/149 |

FOREIGN PATENT DOCUMENTS

EP    1075081    2/2001

OTHER PUBLICATIONS

S.C. Cripps; "Conventional High-Efficiency Amplifier Modes;" RF Power Amplifiers for Wireless Communications; Artech House; Boston; 1999; pp. 45-60.

(Continued)

*Primary Examiner*—Henry Choe
(74) *Attorney, Agent, or Firm*—Nixon & Vanderhye P.C.

(57) ABSTRACT

In the present invention, pre-distortion of drive signal and generation of bias signal to a power amplifier are both controlled dependent on an instantaneous size of the input signal, for producing a predetermined gain characteristics. Preferably, the bias signal is kept low in amplitude ranges having a high probability to occur, thus giving a high efficiency, and is allowed to increase towards higher amplitudes, preferably all the way to the maximum amplitude. The pre-distorted drive signal is preferably higher than the input signal in the high-efficiency ranges. Preferably, the drive signal is predominantly composed of low-order components. In cases where signal paths of bias signal and drive signal differs significantly, inverse filtering is applied to ensure the simultaneousness at the input of the amplitude element.

43 Claims, 7 Drawing Sheets

OTHER PUBLICATIONS

Lawrence J. Kushner; "Output Performance of Idealized Microwave Power Amplifiers;" Microwave Journal; Oct. 1989; pp. 103-116.

K.-J. Youn, et al.; "Low Dissipation Power and High Linearity PCS Power Amplifier with Adaptive Gate Bias Control Circuit;" Electronics Letters; Aug. 15, 1996; vol. 32, No. 17; pp. 1533-1535.

T. Iwai et al.; "42% High-Efficiency Two-Stage HBT Power-Amplifier MMIC for W-CDMA Cellular Phone System;" IEEE Transactions MTT; vol. 48, No. 12, Dec. 2000; pp. 2567-2572.

A. Saleh and D. Cox; "Improving the Power-Added Efficiency of FET Amplifiers Operating with Varying-Envelope Signals;" IEEE Trans. MTT; vol. 31, No. 1; Jan. 1983; pp. 51-56.

T. H. Miers and V. A. Hirsch; "A Thorough Investigation of Dynamic Bias on Linear GaAs FET Power Amplifier Performance;" 1992 IEEE MTT-S Digest; pp. 537-540.

D. R. Conn and R. H. Hemmers; "Increased Efficiency in QAM Power Amplifiers;" 1998 IEEE MTT-S Digest; pp. 1647-1650.

I. K. Stubbs; "A Dynamic Efficient Bias Scheme Improves SSPA Performance in Aeronautical Satellite Communication Systems;" IEEE Colloquium on 'Evolving Technologies for Small Earth Station Hardware;' Digest No. 1995/037; IEEE, London, UK; 44 pp. 5/1-5/8.

Jean-Serge Cardinal and Fadhel M. Ghannouchi; "A New Adaptive Double Envelope Feedback (ADEF) Linearizer for Solid State Power Amplifiers;" IEEE Trans. MTT; vol. 43, No. 7; Jul. 1995; pp. 1508-1515.

\* cited by examiner

EFFICIENT GENERATION OF RADIO FREQUENCY CURRENTS

This application is the U.S. national phase of international application PCT/SE03/00458 filed in English on 19 Mar. 2003, which designated the U.S. PCT/SE03/01068, and claims priority to SE Application No. 0201908-1 filed 19 Jun. 2002. The entire contents of these applications are incorporated herein by reference.

TECHNICAL FIELD

The present invention relates generally to the field of power amplifiers and in particular to efficiency enhancement for power amplifiers.

BACKGROUND

In many wireless communication systems, a power amplifier (PA) used in the transmitter is required to be very linear. High linearity is required to prevent leakage of interfering signal energy between the intended channels. In addition, it has to allow for simultaneous amplification of many radio channels or frequencies spread across a fairly wide bandwidth. In order to reduce power consumption and need for cooling, the amplifier also has to have a high efficiency.

It is difficult to provide linear RF currents with high efficiency for practical high-power RF transistors. Practical high-power RF transistors have a transconductance (output current per input voltage) that is not constant, but changes with the input node voltage. A conventional way of getting a linear RF current response with high DC-to-RF conversion efficiency is to bias the device in a so-called class B operation (for class definitions, see e.g. [1]), where an output current is provided during half of each RF cycle. The biasing is performed by providing a DC voltage offset at the input node, such as the gate of a field-effect transistor (FET) device or the base of a bipolar transistor. If the transconductance of a class B device ideally is constant for positive input signal voltages and zero for negative input signal voltages, the RF output current is linear and the maximum efficiency is 78.5% as discussed e.g. in [2]. Since the DC current consumption is proportional to the RF current, the power efficiency of a class B amplifier is proportional to the output amplitude, provided that the drain or collector supply voltage is kept constant.

In real RF transistors, the transconductance may differ significantly from constant. It can e.g. be a substantially linear function of the input node voltage, or a mixture of a mostly linear part and a mostly constant part. This behavior is normally referred to as quasi-linear. In the case of a purely linear transconductance, the output signal amplitude is proportional to the input signal squared for a class B biased amplifier. Such response is sometimes referred to as a parabolic transfer function.

Since RF power transistors typically are relatively expensive, there is also an incentive to get the most possible output power from them. An important factor in getting the most output power from a transistor is to have the right load impedance at the fundamental frequency, i.e. the desired RF. Practical transistors have limits to both the maximum output current and the maximum output node voltage. To obtain the maximum output power from the device, it is therefore important that these limits are reached simultaneously.

Besides the above-described class B biasing, there are also other biasing possibilities. An amplifier biased in class A is always giving an output current. An amplifier in class AB is biased between class A and class B. A class A amplifier gives the highest output RF power for a given limitation in the maximum peak current, when most devices with linear or quasi-linear transconductance are used. For a device with a constant transconductance, biasing in class A and class B gives the same out-put power, and class AB slightly more. With a tuned load, i.e. all voltage harmonics at the output node perfectly short-circuited or "terminated" by a reactance network, and a device with a linear transconductance, class B operation gives 0.7 dB less output power than class A, see e.g. [2]. By terminating the voltage harmonics, in particular the second harmonic, at the output node makes it possible to use a larger voltage swing of the fundamental frequency. However, the harmonic termination is seldom perfect in practice. Since the harmonic content of the class B current waveform generally is greater than that of class A, the difference in output power can be even larger than 0.7 dB.

Biasing in class C means that the RF current is on during less than half of each RF cycle. This biasing gives generally the highest efficiency, but gives highly nonlinear response and considerably less peak output than either class A or B. In order to maximize the peak output, class A biasing is required, but in order to maximize the efficiency, class C is to prefer. In addition to this linearity considerations have to be taken.

A simple way of getting a linear response from a device with linear transconductance is to bias it in class A. This gives, however a very low average efficiency if the peak-to-average power ratio is high, due to the high quiescent DC supply current. A quasi-linear device can be biased in class AB, and have a substantially linear response for less quiescent current. The average efficiency is therefore better than for devices with linear transconductance biased in class A, but worse than devices with constant transconductance biased in class B. In order to achieve a better linearity, the bias level can be controlled adaptively. Such bias control is generally much slower than the signal variations. Solutions using adaptive bias levels are discussed e.g. in [3-7].

In many cases, bias level adjustments, i.e. choosing the best static bias, are not enough to obtain sufficient linearity. Further linearization methods must typically be employed, see e.g. [5-7]. One often used method for providing high efficiency and wide bandwidth is pre-distortion, used e.g. in [5, 7]. The input signal to the transistor is nonlinearly pre-compensated to counteract the distorting behavior of the transistor itself. In some cases, the linearizing performance of the pre-distortion method is even sufficient to allow for the device to be biased closer to class B, which normally implies a higher degree of non-linearity. However, the quiescent current is reduced and the average efficiency is increased.

Another way of getting a more linear response from a practical device is to use a dynamic bias. This means that the bias level is varied substantially at the same speed as the amplitude of the amplified signal. Examples of such systems are found in [8-13]. In [8], such technique has been used e.g. for improving the power-added efficiency of class A amplifiers with low gain. A constant gain device is used, which can be kept in class A with a bias level proportional to the signal amplitude.

Two different dynamic biasing schemes optimizing either efficiency or intermodulation distortion are compared in [9]. In [10], it is proposed to take care of extra non-linearity introduced by dynamic biasing by applying pre-distortion. Using dynamic biasing to provide constant gain (and therefore linear amplification) with higher efficiency than class A operation is described in [11], and with the addition of feedback for controlling the bias level, in [12]. In [11], the device is biased in class AB at low amplitudes, and ends up in class B at high amplitudes, and in [12] the device is biased in class AB, and the bias variations are only used for small corrections by feedback to the momentary gain. Phase distortion is handled by a separate feedback loop. Constant gain is also the objective in [13], in which a dynamic bias scheme is added onto a Doherty high-efficiency amplifier.

[14] discloses a bias circuitry configured to adjust bias current to one or more power amplifier stages based upon the level of the RF signal to be amplified. The bias circuitry eliminates excessive quiescent bias currents that prior biasing technique required to ensure linear operation by automatically increasing bias currents only as needed based on the effective magnitude of the RF signal to be amplified.

In [15] a power transistor circuitry is disclosed, which for increasing the gain of an amplified RF signal has a power transistor, a voltage bias circuit having a peak detector, and a voltage source. A summer sums the outputs of the peak detector and the voltage source to increase the bias and provide an increased gain upon detection of an RF signal peak.

SUMMARY

A general problem with prior-art power amplifier arrangements is the inability to obtain a good linearity, high output power and high efficiency simultaneously. A further problem is that highly controllable arrangements typically are based on solutions employing large bandwidth, which puts high demands on D/A converters and thereby increases the costs for the devices.

An object of the present invention is to provide devices and methods enabling a better controlled compromise between linearity, high output power, high efficiency and narrow bandwidth. A further object of the present invention is to enhance the efficiency for signal amplitudes having a high probability to appear. Another object of the present invention is to allow for tailoring output signal characteristics depending on the amplifier application.

The above objects are achieved by devices and methods according to the enclosed claims. In general words, generation of bias signal to a power amplifier is controlled dependent on the instantaneous size of the input signal for producing a predetermined output characteristics. The bias signal is selected for efficiency reasons and increases the nonlinearilty of the actual amplifying step. Such nonlinearity is preferably compensated by adapting the drive signal provided to the amplification step. Such modifying comprises preferably pre-distortion of the drive signal or feedback arrangements. Preferably, the bias signal is kept low in amplitude ranges having a high probability to occur, thus giving a high efficiency. Amplification according to class B or class C is used in this region. In order to have access to as high output power as possible, the bias signal is allowed to be higher close to the maximum amplitude, i.e. higher than for a class B amplification. The drive signal amplitude curve is preferably adapted to provide a linear output signal. The adapted drive signal has preferably a higher derivative than the input signal in the low high-efficiency ranges. Preferably, the drive signal is predominantly composed of low-order components. In cases where signal paths of bias signal and drive signal differs significantly concerning delay and frequency response, inverse filtering and/or delay compensation is applied to ensure simultaneousness at the input of the amplitude element.

One of the main advantages with devices and methods according to the present invention is that the increased controlling possibilities of both drive and bias signals gives an additional freedom in controlling the power amplifier operation. This additional freedom can be used in different applications to enhance certain requested properties, e.g. linearity, efficiency, low bandwidth etc.

BRIEF DESCRIPTION OF THE DRAWINGS

The invention, together with further objects and advantages thereof, may best be understood by making reference to the following description taken together with the accompanying drawings, in which:

FIG. 4a is a diagram illustrating drive signal and bias signal provided to an amplifier element as a function of input signal amplitude, according to a prior-art device using dynamic bias;

FIG. 7a is a diagram illustrating the frequency distribution of a drive signal according to the embodiment of FIG. 4a;

DETAILED DESCRIPTION

Figure 1:
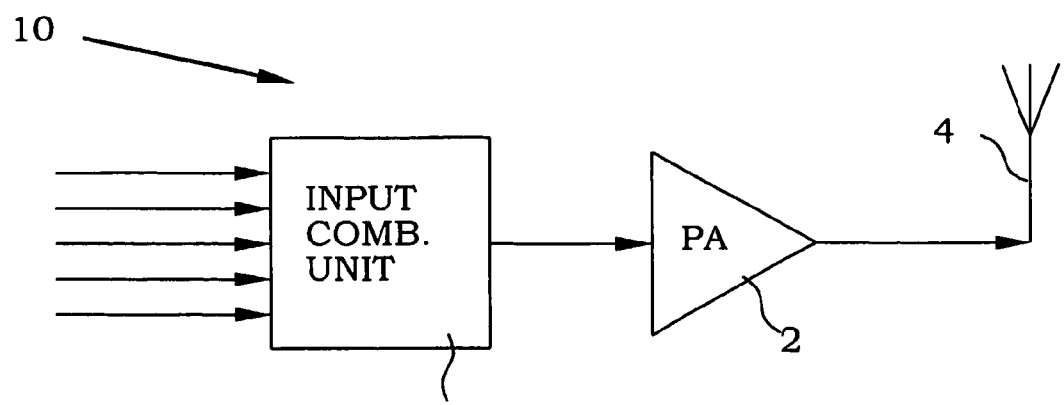
FIG. 1 is a schematic drawing of a transmitter having a radio frequency power amplifier.

In a radio frequency application for power amplifiers, as illustrated e.g. in FIG. 1, a power amplifier 2 is arranged in a radio transmitter 10 for amplification of several narrowband channels simultaneously. The radio transmitter 10 comprises in this embodiment of a general input combination unit 6, receiving input signals from a number of sources, each one representing a channel, carrier etc. The input signals are combined in the general input combination unit 6 into a multi-channel signal. The multi-channel signal is provided to the power amplifier 2 for simultaneous amplification. The amplified signal is finally provided to a transmission element 4. Alternatively, base-band signals are provided as input signals and an up-conversion to the radio frequency is additionally provided. The details of the operation are omitted, since they are performed according to conventional techniques and do not concern the essential parts of the present invention.

In order to preserve the phases and amplitudes of all signal components in the amplification process and to prevent leakage of interference signal energy into frequency bands outside the channels, a high degree of linearity is required in such an amplifier.

Power amplifiers can be found in many fields of technology. The applications may range from consumer electronics, radar technology to radio communication. The transmitter illustrated in FIG. 1 is assumed to be a part of a radio communication system. It should though be understood that the invention is not limited thereto, and that other applications are feasible as well. However, references to applications within the field of radio communication will be made in the present disclosure for serving as examples.

Figure 2:
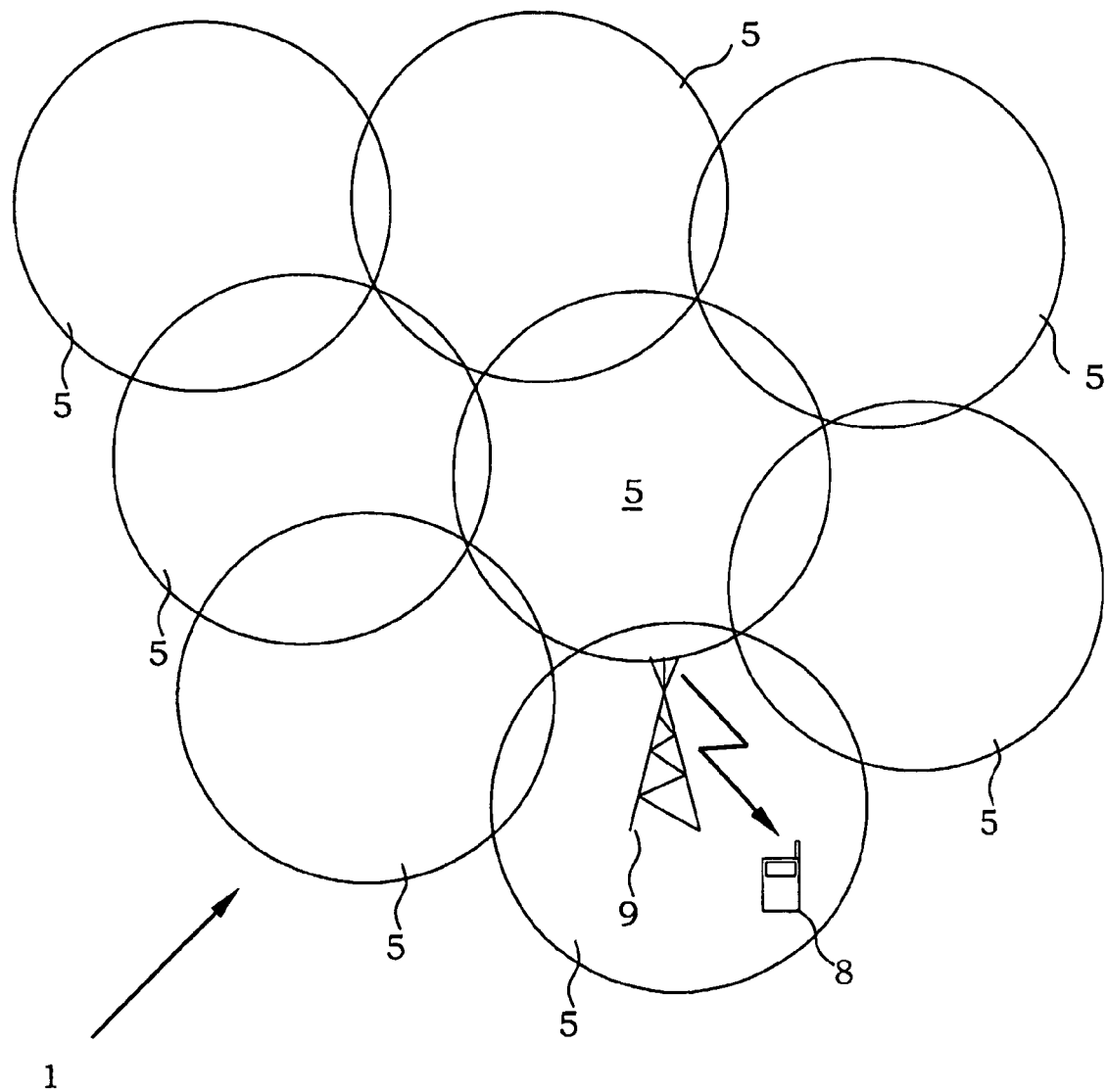
FIG. 2 is a schematic drawing of a wireless communication system.

An embodiment of a radio communication system 1 is illustrated in FIG. 2. The system comprises a number of cells 5, covering a certain system area. Each cell 5 has an associated base station 9, which provides for radio communication within cell boundaries, represented by circles in FIG. 2. In this particular embodiment, the radio communication is provided by omni-directional transmitters. A mobile unit 8 being present in one of the cell communicates with the base station 9 of that cell. For reducing complexity of the illustration, only one base station 9 and one mobile unit 8 have been illustrated in the figure. The base station 9 and/or the mobile unit 8 may be equipped with a transmitter equipment, e.g. according to FIG. 1, and the power amplifier is preferably designed according to the present invention.

Figure 8:
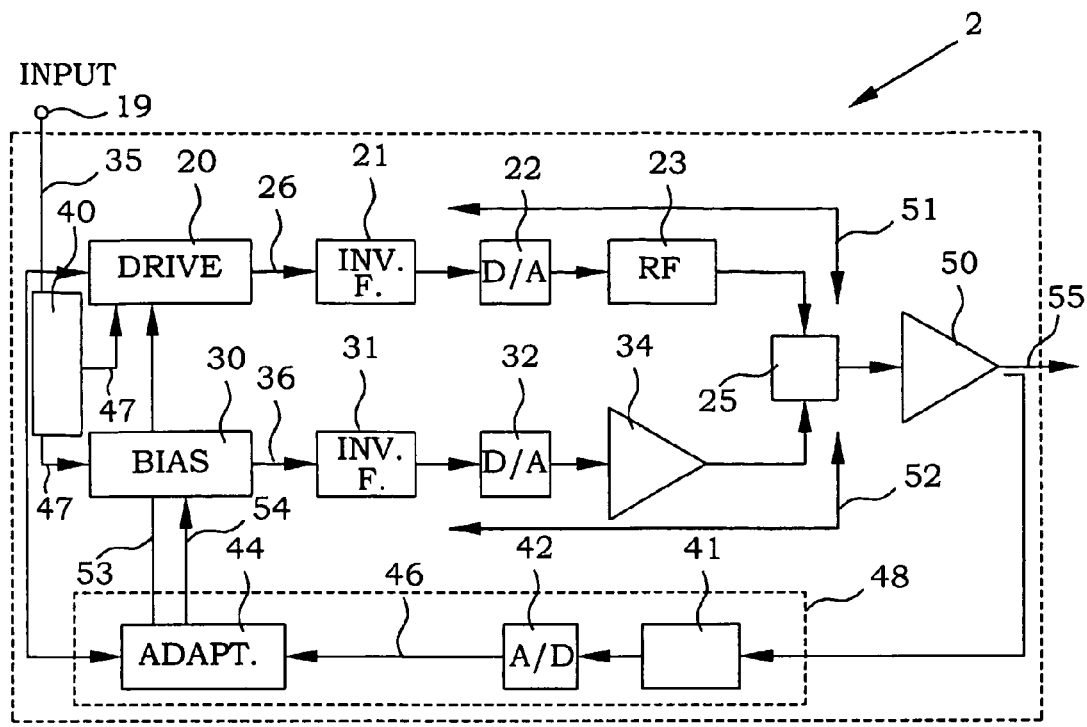
FIG. 8 is a block diagram of an embodiment of a power amplifier according to the present invention.

In FIG. 8, an embodiment of a power amplifier 2 is illustrated. The power amplifier 2 comprises a input signal terminal 53, on which a input signal 35 is received. This signal is intended to be amplified and provided as a radio frequency output signal 55. The input signal 35 is in this embodiment a digital signal representing a baseband version of the signal to be transmitted. The input signal terminal 53 is connected to a pre-distortion unit 20, which pre-distorts the input signal 35 into a drive signal 26. This pre-distortion will be described more in detail further below. The pre-distortion unit 20 is in this embodiment a digital pre-distortion unit 20.

The input signal terminal 19 is also connected to an input detector 40, which is arranged to determine an instantaneous (envelope) size measure of the input signal 35. The size measure is preferably the power of the input signal 35 or a quantity derivable therefrom, e.g. amplitude. The input detector 40 has an output connected to the pre-distortion unit 20, whereby the pre-distortion unit 20 can apply a pre-distortion dependent on an signal 47 representing the instantaneous amplitude of the input signal 35.

An output of the input detector 40 is also connected to a bias signal generator 30, which generates a bias signal 36 to be used for providing the actual amplification operation. The bias signal generator 30 can thus provide a bias signal 36 dependent on an signal 47 representing the instantaneous amplitude of the input signal 35. In the present embodiment, the bias signal generator 30 is digital.

In the present embodiment, the input detector 40 is indicated as a separate unit. However, the input detector 40 can also be implemented as a part of the pre-distortion unit 20 and/or the bias signal generator 30, respectively.

The drive signal 26 is in the present embodiment processed in an inverse filter device 21, described somewhat more in detail further below. The inverse filter device 21 is in this embodiment digital. The filtered (and/or delay compensated) signal is brought further to a digital-to-analogue converter (D/A) 22 for the provision of an analogue signal. The signal is then in this embodiment modulated to a radio-frequency a RF chain 23.

The bias signal 36 is according to the present embodiment similarly treated in an inverse filter device 31. The filtered (and/or delay compensated) signal is then brought further to a digital-to-analogue converter (D/A) 32 for the provision of an analogue bias signal, which subsequently is amplified in a bias amplifier 34.

The drive signal and the bias signal are matched in a matching unit 25 and provided to an amplifier element 50, performing the actual amplification according to the selected drive signal and bias signal. A radio frequency output signal 55 is thus provided.

The drive signal passes through a number of steps in a drive signal path 51, between the inverse filter device 21 and the matching unit 25. The signal processing, digital and/or analogue, along the drive signal path 51 may influence the delay and frequency response of the drive signal. Similarly, the bias signal also passes through a number of steps in a bias signal path 52, between the inverse filter device 31 and the matching unit 25. The signal processing, digital and/or analogue, along the bias signal path 52 may influence the frequency responses and delay of the bias signal. If response and delay differences along the different signal paths 51, 52 differs, which is the case in a typical amplifier, the drive signal arriving at the amplifier element 50 does not correspond to the bias signal arriving at the same time, unless inverse filtering and/or delay compensation is performed. Such compensation or means for causing simultaneousness comprises in the present embodiment the two inverse filter devices 21 and 31, respectively. The parts mostly responsible for frequency dependencies are the radio frequency chain, which typically includes several filters, the radio frequency match and the bias network and the bias amplifier. The inverse filter device 21 causes distortion and/or delay compensation of the drive signal, which is inverse to the distortions and delays caused during the signal path 51, thereby the name. It means that when the signal has passed both the inverse filter 21 and the signal path 51, substantially all distortions have cancelled and delays are equal. Similarly, the inverse filter device 31 causes a distorted frequency response and delay compensation of the bias signal that is inverse to the distortions and delays caused during the signal path 52. It analogously means that when the bias signal has passed both the inverse filter device 31 and the signal path 52, all distortions have cancelled each other. The safest way to accomplish that the drive and bias signals are simultaneous at the input node is to inverse-filter both parts. This takes away the frequency dependencies for the nonlinearly processed signals within the bandwidth of the inverse filters.

In particular in high-linearity wideband applications, it is important that the bias and pre-distorted drive signal coincide at the input node of the amplifier element.

The power amplifier 2 of the illustrated embodiment also comprises a feed-back arrangement 48. The radio frequency output signal 55 is sensed by a feedback sensor 41. The feedback sensor 41 also preferably performs a radio-frequency down-conversion. The sensor signal is processed in an analogue-to-digital (A/D) converter providing a signal 46 representing the radio frequency output signal 55. This signal 46 and the input signal are provided to an adaptation unit 44. The adaptation unit 44 modifies the operation of the bias signal generator 30 and the pre-distortion unit 20 by supplying coefficient modifications of coefficients stored in the look-up tables 53, 54. The bias signal generator 30 and the pre-distortion unit 20 are arranged to adapt their actions accordingly.

From FIG. 8 it is easily seen that there are means for detecting the instantaneous amplitude of the input signal and to use this information for controlling the bias signal as well as the pre-distortion of the drive signal in order to achieve an output signal of requested properties.

Figure 3:
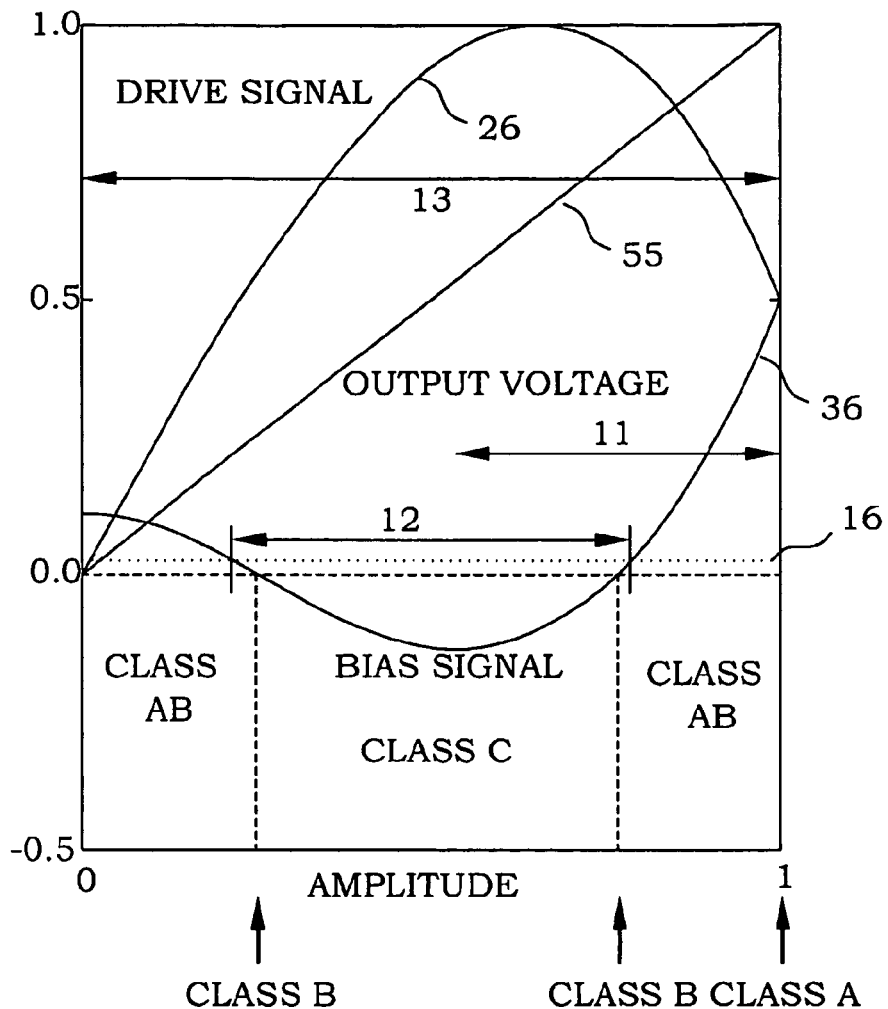
FIG. 3 is a diagram illustrating drive signal and bias signal provided to an amplifier element as a function of input signal amplitude, according to an embodiment of the present invention.

The output of an amplifier element, e.g. a field-effect transistor or a bipolar transistor, is basically dependent on the drive signals, a bias signal and the inherent amplification properties of the amplifier element. According to the present invention, both the drive signal and the bias signal are controlled based on the amplitude of the input signal. In FIG. 3, drive signal 26 and bias signal 36 used in an operation of a power amplifier according to an embodiment of the present invention based on a linear-transconductance amplifier element is illustrated. The amplitude of the drive signal 26 and bias signal 36 are plotted as functions of the amplitude of the input signal. An output signal 55 of the amplifier element is also illustrated. In this particular embodiment, one object is to keep the output signal 55 linear with respect to the input signal. A linear amplitude range 13 covers in this embodiment thus the entire amplitude range. As an additional object, the total power consumption of the arrangement is kept low and also the bandwidth of the drive signal.

A power amplifier can be biased in many different ways. Operating a power amplifier as a so-called class A amplifier means that the amplifier is constantly conducting and delivers a instantaneous current that is higher than zero. To achieve this, the power amplifier is biased to a DC voltage corresponding to the peak amplitude of the radio frequency input voltage. This is the only way to get maximum radio-frequency current, and hence maximum output power for linear transconductance and most cases of quasi-linear transconductance devices. Well-adjusted class A biasing can give good linearity, but sometimes not enough for demanding applications. In such cases, further linearization is needed. However, the quiescent current in class A is large, which means that the efficiency becomes very poor. Adaptive quasi-static biasing, see e.g. [3-7] does not improve efficiency but provides the adjustment to the class A amplifiers for improving linearity.

For keeping a good efficiency, but still having access to the maximum power, the bias signal according to the present invention is preferably controlled to give a class A operation for the maximum amplitude. However, for lower amplitudes, the biasing level is reduced. In other words, there exists a first amplitude, such that the amplitude-averaged value of the bias signal for an amplitude interval over this first amplitude is higher than the amplitude-averaged bias signal as taken over the entire amplitude range.

Figure 6:
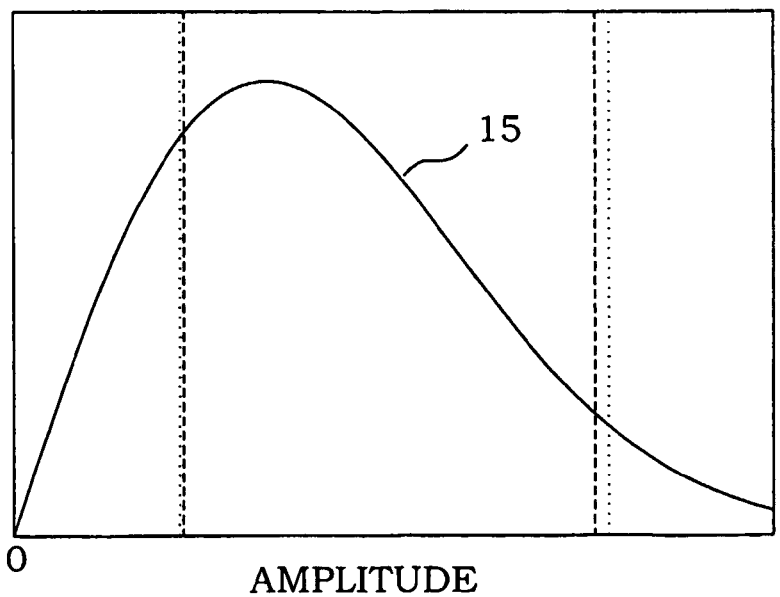
FIG. 6 is a diagram illustrating the probability amplitude distribution for a typical multi-carrier signal.

The average efficiency is not much affected by doing this, since there is a low probability for the highest amplitudes to occur. The amplitude probability density of a mix of sufficiently many independent radio frequency channels tends to be similar to a Rayleigh distribution, having a large peak-to-average power ratio. In FIG. 6, an example of such a amplitude probability density distribution 15 is illustrated. Here it can be seen that a very small portion of the amplitude distribution appears at or close to the maximum amplitude. A decreased efficiency for the highest amplitudes will thus not affect the total efficiency in any substantial manner.

When discussing bias levels in the present disclosure, these levels are generally given relative to a turn-on voltage of the power amplifier.

A class B operation corresponds to a biasing, which delivers half-wave rectified current pulses, conducting during half a radio frequency cycle.

Class AB denotes the bias region between class A and class B. A further reduction of the biasing level, i.e. the introduction of negative biasing potentials reduces the "on"-period further and so the total efficiency increases. Such negative biasing is referred to as class C.

Returning to FIG. 3, the amplitude of the drive signal here consists of a mixture of the first and third powers of the input amplitude, which means that this signal can be contained within three times the bandwidth of the input signal. This will be discussed further below. The bias signal to the amplifier is dynamically changed according to the curve shown, for achieving a linear output signal with the employed drive signal. Due to the substantial amount of class C operation, the average efficiency is good.

Both the pre-distortion of the drive signal and the bias level can be calculated from the squared amplitude (i.e. normalized instantaneous power) of the input signal, or by the envelope of the input signal, i.e. its amplitude.

For amplitudes differing considerably from maximum amplitude, it is typically unsuitable to use class A amplification, due to the loss in efficiency. From FIG. 3 it is easily seen that when reducing the amplitude from maximum amplitude, the bias signal decreases in this embodiment through class AB operation, passes class B operation and in the intermediate amplitude range, a class C operation is used. Thus, in an amplitude range 11, the bias signal increases with increasing input signal amplitude. Preferably, this increase continues all the way to the maximum amplitude in order to provide class A operation only at amplitudes close to the maximum.

A dotted line 16 indicates the mean bias level averaged over the entire amplitude range. In FIG. 3 it can be noted that the bias signal 36 is kept below this amplitude-averaged bias level in an amplitude range 12. The amplitude range 12 thus represents a range, where the efficiency of the amplifier is relatively high. By comparing FIG. 3 and FIG. 6, one realizes that class C operation, i.e. within broken lines, as well as operation within the range 12 (dotted lines) falls in an amplitude range having a large portion of the total amplitude distribution. In other words, a large portion of all signals to be amplified fall within the range 12. This will increase the overall efficiency of the power amplifier.

A constant bias amplifier is generally nonlinear. Prior art dynamic bias systems typically aims to remove or at least reduce this nonlinearity. When considering the actual amplification step in the present invention, i.e. comparing the drive signal and the output signal, the biasing according to the above ideas gives rise to an increased nonlinearity. Instead, this biasing concepts open up for a more efficient use of the amplifier. In applications where linearity is of importance, the increased nonlinearity is instead compensated by adapting the drive signal before the actual amplification.

Such drive signal adaptation is preferably performed by pre-distortion. However, other approaches to modify the drive signal, such as feedback arrangements can also be used.

Figure 4A:
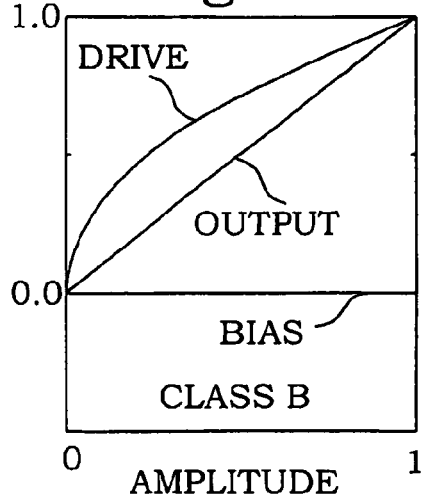
FIG. 4a is a diagram illustrating drive signal and bias signal provided to an amplifier element as a function of input signal amplitude, according to a prior-art pre-distorting device.
Figure 4B:
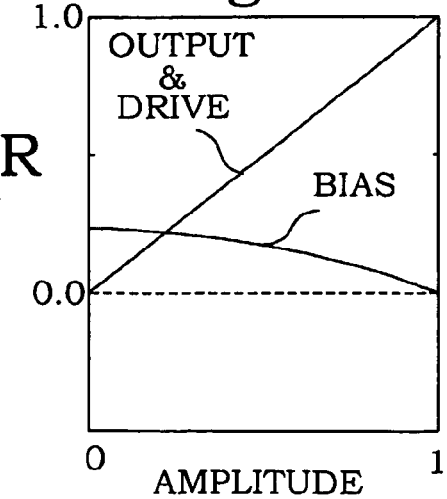

In FIG. 4a, drive signal, output signal and bias signal for a class B amplifier with pre-distortion according to prior art are illustrated as functions of amplitude. Similarly, in FIG. 4b, drive signal, output signal and bias signal for an amplifier with dynamic bias according to prior art, e.g. [11], are illustrated as functions of amplitude. It can here be noted that the dynamic bias signal presents a monotonically decreasing behavior, in sharp contrast to the increasing behavior in range 11 (FIG. 3) discussed above. These two systems are in the following used as comparison to the devices according to the present invention. The peak amplitude for the systems of FIG. 3, FIG. 4a and FIG. 4b are equal.

A solution according to the state of the art to the problem of biasing in or near class B when using practical devices is typically to use dynamic biasing to get a constant gain over the input range, as seen in e.g. [8, 11, 12, 13]. Three major problems are associated with this. First, for systems with high linearity requirements, constant gain is not enough to ensure linearity. The amplifier also has an amplitude to phase distortion, which is not addressed by the dynamic biasing and thus needs further linearization, i.e. pre-distortion such as in [10] or feedback such as in [12].

The second problem is that constant-gain dynamic biasing excludes the possibility of obtaining maximum power while maintaining a high efficiency. This is because the maximum output power is associated with operation in pure class A, which also has the highest gain. The amplifier must then, for operation with constant gain and maximum peak output power, be biased essentially always in class A. This degrades efficiency drastically.

The third problem is that efficiency is lower than with class B biasing, since the device is biased in class AB at low and medium levels [11, 12, 13]. The difficulty of simultaneously obtaining high linearity and high efficiency is further illustrated in [9].

The conclusion is that the state-of-the-art solutions using dynamic biasing have deficiencies in several ways, mostly associated with obtaining high efficiency together with high output power and good linearity. However, these deficiencies are easily overcome by devices and methods according to the present invention.

Figure 5:
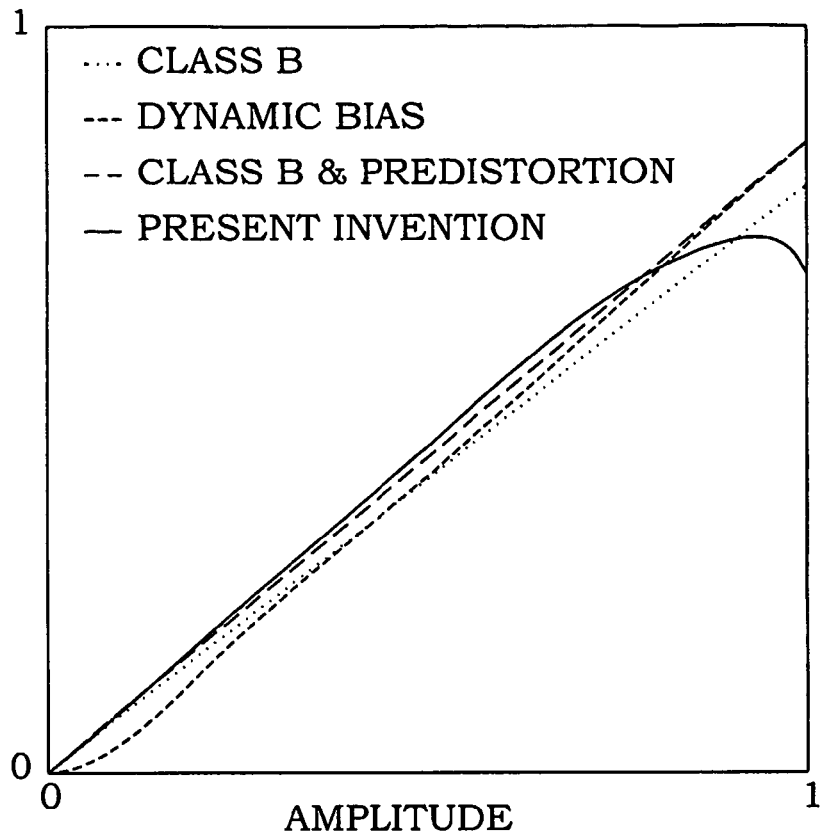
FIG. 5 is a diagram illustrating the efficiency of the embodiments of FIG. 3, FIG. 4a and FIG. 4b.

In FIG. 5, the efficiency of a class B amplifier with constant transconductance is plotted in a diagram as a function of input amplitude as a dotted line. The efficiency of the system of FIG. 4a is plotted in the diagram as a function of input amplitude as a broken line with short sections. The efficiency of the system of FIG. 4b is plotted in the diagram as a function of input amplitude as a broken line with long sections. Finally, the efficiency of the system of FIG. 3 is plotted in the diagram as a function of input amplitude as a full line. From this, it is easily seen that both the dynamic bias system and the pure class B amplifier are less efficient than the pre-distorted amplifier and the present invention in those regions having the highest amplitude distribution probability. The average efficiencies, for a signal having a 10-dB peak-to-average Rayleigh amplitude distribution are 30% for class B with pre-distortion, 24% for dynamic biasing and 30% for the embodiment according to FIG. 3.

A large disadvantage with class B amplifier with pre-distortion, besides the problem of not obtaining maximum power, is that a large bandwidth has to be used. A major cause of the large bandwidth expansion for the radio frequency drive signal in the pre-distorted class B amplifier is the very low gain at low levels for linear transconductance devices or quasi-linear transconductance devices, which need to be counteracted by a substantially root function amplitude distortion, as further explained here below. The constant gain dynamic biasing solves this problem, but with a severe penalty in efficiency, as seen above.

The trade-off involved in the choice of bias level (static or quasi-static) and predistortion is mainly the bandwidth expansion. The closer the circuit is biased towards class B, the more pronounced is the non-linear response. For linear transconductance devices, this response develops towards the square of the input signal amplitude. The pre-distortion that counteracts this development therefore develops towards a root function in amplitude. Such a function has a very large bandwidth, i.e. a large bandwidth expansion, compared with the original signal. For a certain level of linearity in the output, the bandwidth of the predistortion circuitry must thus be made much greater for a device biased in class B than for devices biased more into the class AB region. Since high-precision pre-distortion is usually performed with a digital processing, a wider pre-distortion bandwidth means that more wideband digital-to-analogue (D/A) converters must be used. These converters are generally more expensive than more narrowband ones, and in some cases the required combination of precision and bandwidth does not even exist, making it impossible to increase efficiency by biasing more towards class B with maintained linearity.

The solution to this, as offered by the present invention, e.g. FIG. 3, is to abandon constant gain biasing in favor of something that allows for greater efficiency. This can be accomplished by the earlier demonstrated class C biasing in the region where the amplitude of a multi-carrier or multi-user signal spends most of the time, i.e. in the middle region. This is combined with a boost in drive amplitude in this region, to counteract the lower gain coming from biasing in class C. The non-linear drive boost can be forced to occupy a much narrower bandwidth than the pre-distortion bandwidth of the class B amplifier, by mainly allowing only an odd-powers, low-order modification.

The modified, substantially low-order, amplitude function of the drive signal in FIG. 3 can not generally compensate for the low gain of class B, or even lower gain of class C biasing, at low amplitude levels. This means that the amplifier must be taken out of this high-efficiency mode in this amplitude region, which can be accomplished by biasing in class A or AB. The average efficiency loss for this is not very high, however, since the amplitude probability density generally is low also for low amplitudes.

By comparing FIG. 3 and FIG. 4a, it can be noticed that in FIG. 3, the drive signal has a pronounced maximum at intermediate amplitudes, while the gradient at low amplitudes is kept relatively low. Such a shape of the pre-distortion is relatively easy to achieve by using low-order components. The sharp initial increase of the pre-distorted drive signal to the class B of FIG. 4a requires a fairly high degree of high-order components.

In a comparison between the systems discussed above, it can be noted that the system according to the present invention has at least 0.7 dB more peak output power, which means that the optimum load resistance for such a system, peaking in class A, is 85% of that of the two other systems, peaking in class B. This is because the peak voltage amplitudes are equal for the three systems, if they all have perfect termination of the harmonics and equal supply voltages. The harmonics of the current wave form are considerably lower in the peak amplitude range for the system according to the present invention. The demands for termination will therefore also be reduced.

Figure 7A:
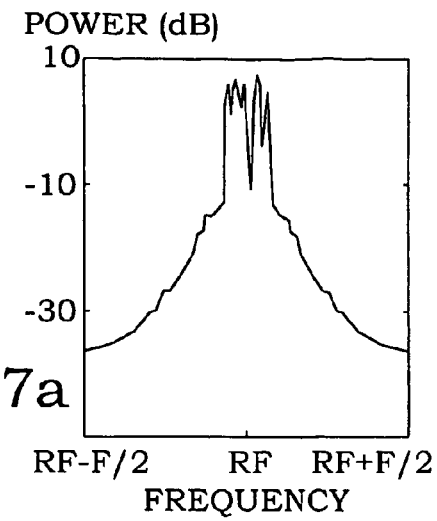
Figure 7B:
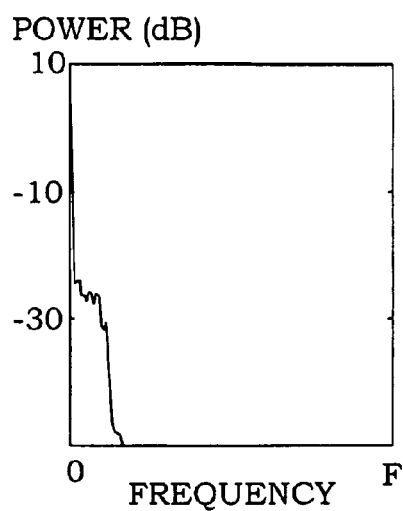
FIG. 7b is a diagram illustrating the frequency distribution of a bias signal according to the embodiment of FIG. 4b.
Figure 7C:
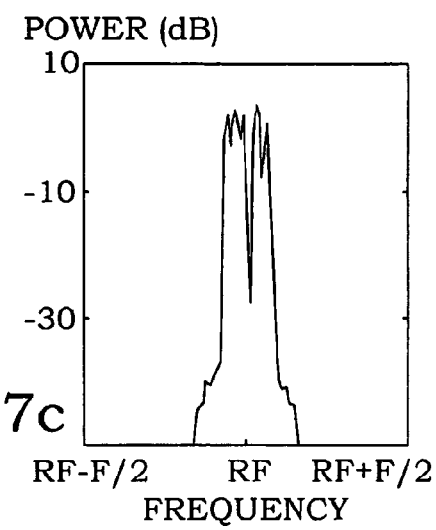
FIG. 7c is a diagram illustrating the frequency distribution of a drive signal according to the embodiment of FIG. 4c.
Figure 7D:
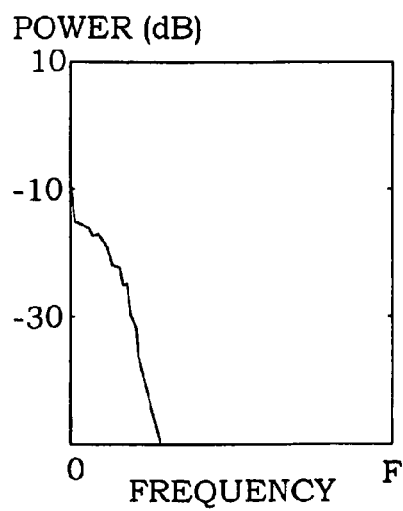
FIG. 7d is a diagram illustrating the frequency distribution of a bias signal according to an embodiment of the present invention.
Figure 7E:
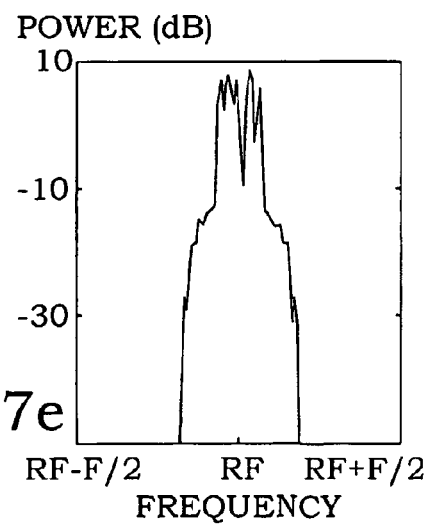
FIG. 7e is a diagram illustrating the frequency distribution of a drive signal according to an embodiment of the present invention.

The bandwidth requirements are illustrated in FIGS. 7a-e. The bandwidth expansions of the processed drive signal for the three cases of FIG. 3, FIG. 4a and FIG. 4b are shown as well as the bandwidth of the bias signal. FIG. 7a illustrates the pre-distorted class B amplifier, and the root shape of the drive signal results in a broad bandwidth expansion. The bias signal for this case is not shown, since it consists of only DC or slowly adjusted DC, which needs only a very narrowband D/A converter. FIG. 7b illustrates the bias signal of the the constant gain dynamic bias case. FIG. 7c illustrates the corresponding drive signal, centered around a central radio frequency. The bias signal is dominated by DC and a second order component in the amplitude. The bias signal therefore has the same bandwidth as the input signal. However, the drive signal bandwidth is significantly narrower. Finally, in FIGS. 7d and 7e, bias signal and drive signal, respectively, of an embodiment of the present invention corresponding to FIG. 3 is illustrated. Here it is seen that the bias signal has significant components above order four, which means that it has at least twice the input signal bandwidth. However, the drive signal consists of predominantly first and third order components, which means that the bandwidth expansion is reduced to about three times the input signal bandwidth. The requirements on the D/A converters are thus kept at a relatively moderate level.

The above discussed bandwidth diagrams are only examples of possible cases. Cases with better or worse bandwidth distribution than the discussed ones may be provided.

The radio frequency and bias signal spectra show that this example of the new system according to the present invention in practice does not require more available D/A converter bandwidth for producing the radio frequency signal than the constant gain dynamic bias scheme, even if the level of the sidebands is higher. Furthermore, the total bandwidth of the radio frequency signal for the class B amplifier with pre-distortion might well need to be larger than the combined radio frequency and bias bandwidths of the new system for achieving linearity. This is important, since not only does the new system split the bandwidth requirement in two parts, which by itself makes it easier to find D/A converters that fit, but it also lessens the total requirement for D/A bandwidth.

Figure 9:
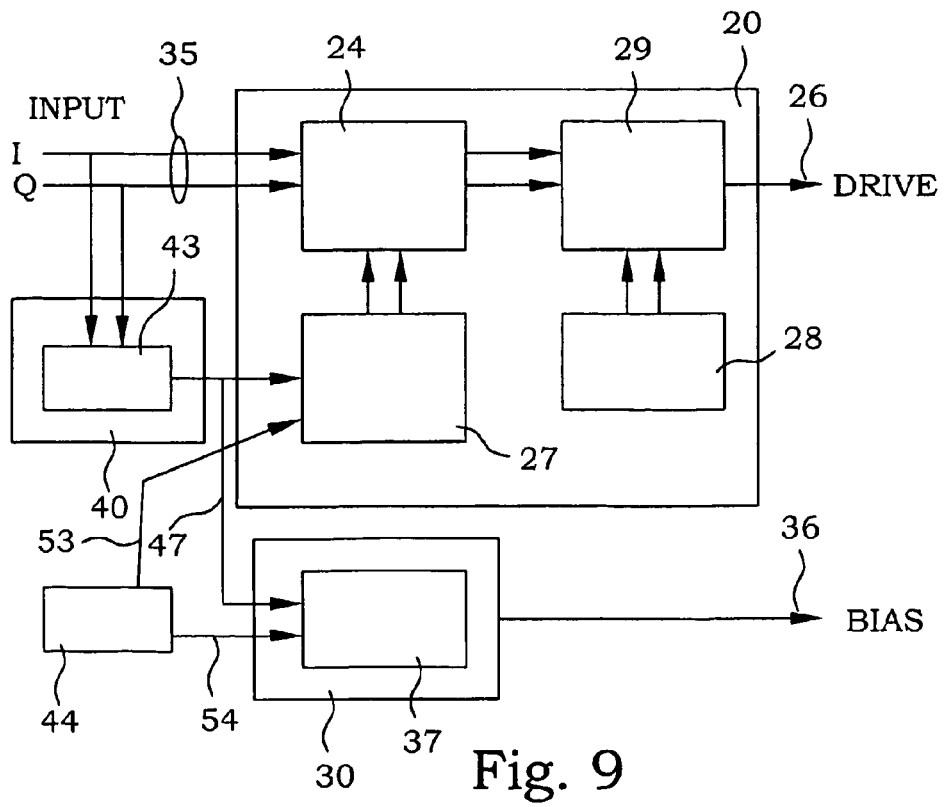
FIG. 9 is a block diagram of a preferred embodiment according to the present invention for providing control of drive and bias signals.

In the case of an input signal is in digital, complex number form, the squared amplitude is easily calculated as the sum of the squared in-phase (I) and quadrature-phase (Q) components. FIG. 9 illustrates a detail of a possible system using the squared amplitude as the input to a stored-table lookup system for providing radio frequency drive and bias modifications. Preferably, the lookup system is improved by interpolation. The components of the digital complex input signal are summed quadratically in a squaring and summing unit 43 of the input detector 40. This squared amplitude is provided as a control signal 47 as in input to a complex table 27 of the pre-distortion unit 20. The output of the complex table 27 may be interpolations between table values and provided to a complex multiplier 24, where the complex table 27 output is multiplied with the input signal 35. The result is provided to a complex-to-real upconverter 29 supplied by a digital oscillator 28. The result is provided as the drive signal 26.

Similarly, the control signal 47 is also provided as an input to a real table 37 of the bias signal generator. The output of the real table 37 may be interpolations between table values and provided as the bias signal 36.

This arrangement is also easily integrated with an adaptation means 44. The tables are in such an arrangement preferably adapted to maintain linearity and output power also when circuit parameters change due to temperature and drift. This adaption is performed by signals representing coefficient modifications of the coefficients stored in the look-up tables. These coefficient modifications are provided from the adaptation means 44 to the complex table 27 and the real table 37, respectively.

Figure 12:
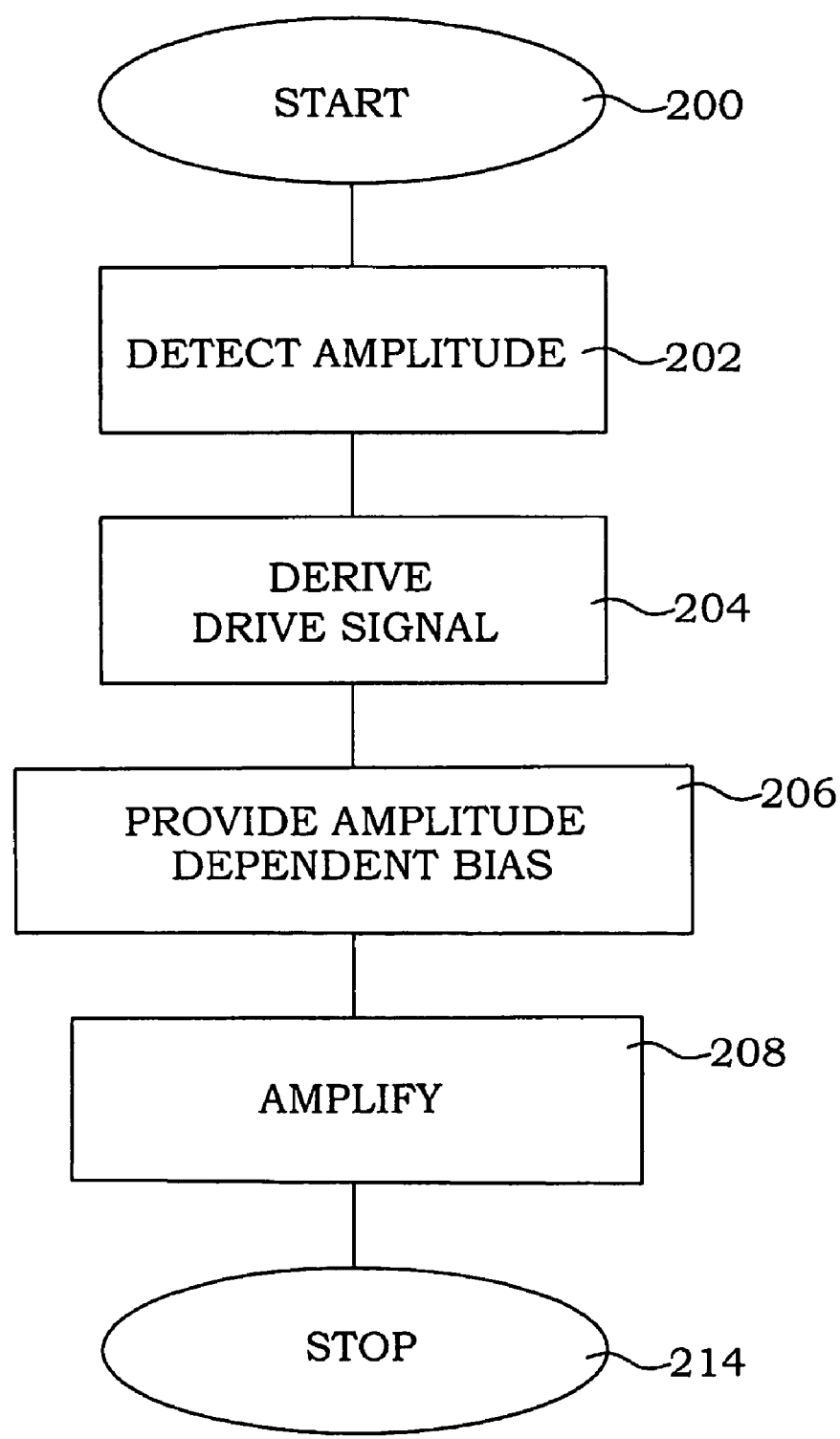
FIG. 12 is a flow diagram illustrating the main steps in an embodiment of a method according to the present invention.

FIG. 12 illustrates the main steps of an embodiment of a method according to the present invention. The procedure starts in step 200. In step 202, the instantaneous amplitude of the input signal, or a quantity related thereto and derivable therefrom, is detected. A drive signal is derived from the input signal in step 204. This drive signal deriving is preferably a pre-distortion of the input signal, dependent on the determined amplitude. In step 206, a bias signal is generated, which also is dependent on the determined amplitude. In step 208, the drive signal is amplified using the bias signal level to provide an output signal. The procedure ends in step 214.

Thus, by using the properties of the projected amplitude probability distribution, it is possible to perform modifications in drive and bias signals that reduces the radio frequency drive bandwidth expansion and increases output power relative to the pre-distorted class B amplifier, and increases efficiency and output power compared to constant-gain dynamic biasing schemes.

When quasi-linear transconductance devices are used, the same ideas can be used as for the system of FIG. 3. Usually, the maximum power is obtained by peaking in class A, but if the constant part of the transconductance curve is large, peaking in class AB bias might give the highest output power. This is also the case for truly constant-transconductance devices. The method according to the present invention can easily be modified to provide peaking in the highest output power class AB mode.

By allowing both the pre-distortion and the bias signal to vary with input signal amplitude, one additional degree of freedom is achieved, which can be used in order to optimize the system behavior in different aspects. When bandwidth is a limiting factor, it may be wise to first select a suitable pre-distortion function, having the desired bandwidth. Thereafter, the bias signal can be adjusted on order to provide the required output characteristics. However, the opposite procedure is also possible, i.e. first determine a suitable bias signal function and then adapt the pre-distorted drive signal according to bias signal. It is furthermore possible to adapt both the bias signal function and the pre-distorted drive signal to achieve the required properties.

In the previous examples of the new system, some specific choices have been made. For example, the bandwidth of the drive signal has been forced to stay within three times the input signal bandwidth. In case wider bandwidth can be afforded in the D/A converters and radio frequency chains this can be used to improve efficiency. Higher average efficiency can be obtained if the class AB and A regions for low and high amplitudes can be made smaller, thus increasing the class C region. This requires the use of a more wideband radio frequency drive signal.

The limitation of bandwidth expansion for the radio frequency drive signal does not have to be carried out by explicitly using only low and odd powers of the input amplitude. In practice, higher powers, and functions not described by a power series, can be allowed, provided that the signal has little energy outside the allowed frequency range.

If one of the improvements that are possible with the new system is more important than the others, only a part of the ideas may be needed. This can in some cases reduce the complexity, or give improved performance. For example, using the highest output power class A (or AB) biasing in the high end can be combined with class B, root function pre-distortion in the low end, with or without using an intermediate class C region. In this case the ideas are to be applied to an already existing system. The strategy is to make the fullest use of the bandwidth capabilities in the system, to improve efficiency, output power, or both.

An issue related to maximum power is the output power when the amplifier is overdriven. Overdrive is reflected in the output current waveform as a flattening of, or sometimes even a dip in, its uppermost part. This waveform can contain more fundamental radio frequency current than the non-flattened waveform, and so can give some increase in output power. To make use of this potential output power increase, drive and bias level modifications that together give linear output in the overdriven region must be determined. To limit the bandwidth expansion for this case, it may be useful to use another bias signal shape in the high end of the non-overdriven amplitude region, to go more smoothly into the overdriven region. It should also be noted that more harmonics are generated under overdriven conditions, which can be detrimental to the system.

Figure 10:
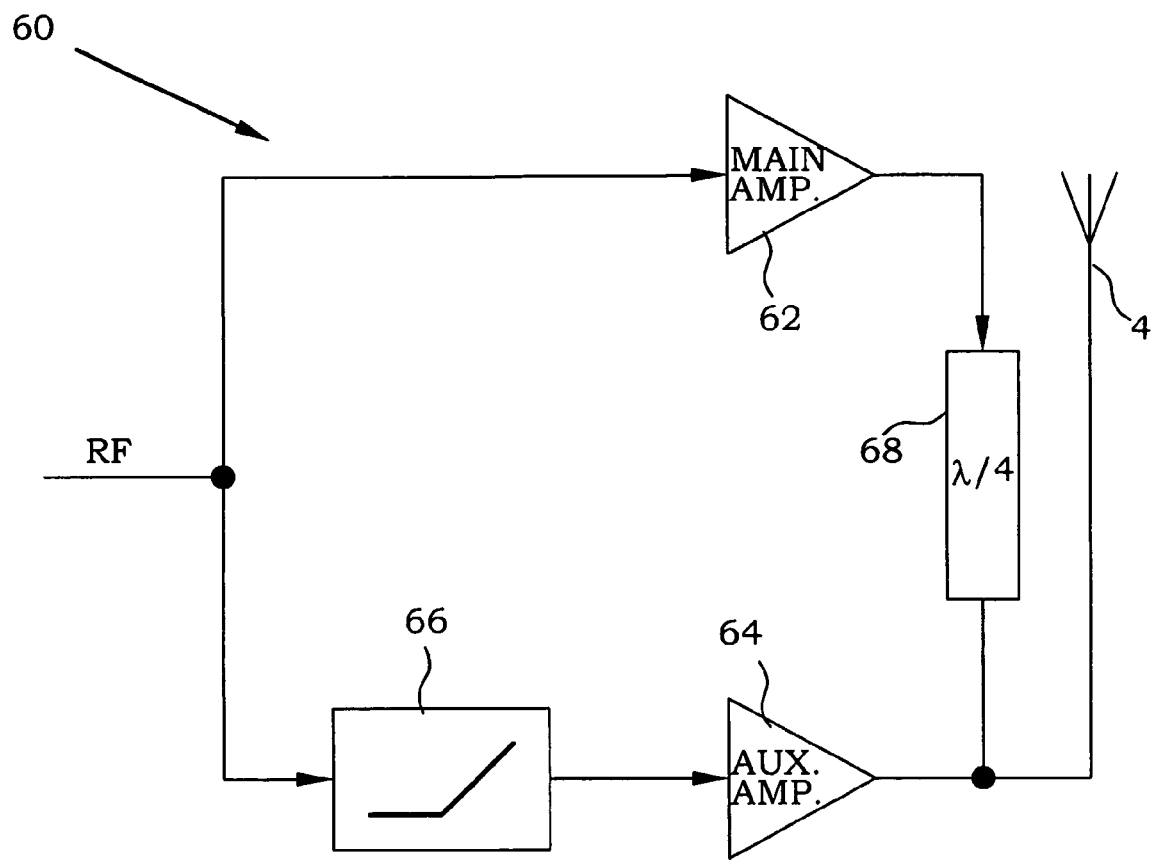
FIG. 10 is a block diagram of a Doherty amplifier arrangement, in which an amplifier according to the present invention is useful.

The ideas used in the present invention can also be used for generating e.g. the non-linear currents of a Doherty "auxiliary" amplifier, for improving such a system to cope with linear-transconductance devices and increasing output power. A typical embodiment of a Doherty amplifier arrangement 60 is illustrated in FIG. 10. A radio frequency signal is simultaneously provided to a main amplifier 62 and an auxiliary amplifier 64. The drive signal to the auxiliary amplifier 64 is modified in a controller 66 in order to achieve an operation of the auxiliary amplifier 64 (also called peaking amplifier) only at high amplitudes. The output signals are combined with a quarter wavelength difference 68 to provide the output signal to the transmitter 4. The particular details of the arrangement is not of particular importance for the present invention, but the important feature is the operation of the auxiliary amplifier 64. The operation is performed as a function of the input signal amplitude, whereby the auxiliary amplifier 64 will start to give a zero output, and only above a certain amplitude give a linear output.

Here, the most important thing is to reduce the average DC current consumption, while at the same time obtain the maximum output radio frequency current for the signal peaks. This means that, for all linear and most quasi-linear transconductance transistors, class A should be used at the peaks. Since ideally no radio frequency current should be produced at amplitude levels below a certain point in amplitude dimension, the device can be biased in class C at low amplitude levels. I prior art, class C is typically used all the time for linear and quasi-linear transconductance transistors which limits output power and efficiency.

Figure 11:
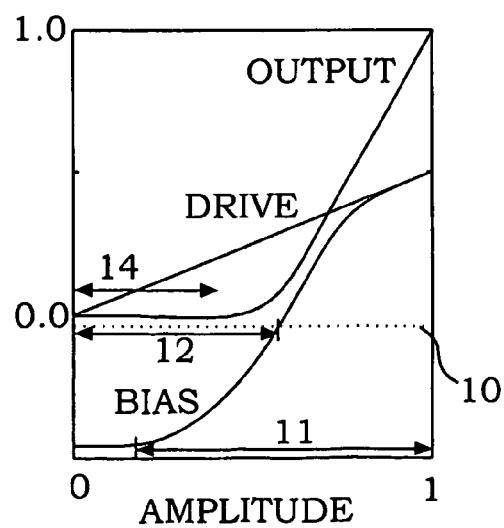
FIG. 11 is a diagram illustrating drive signal and bias signal provided to an amplifier element as a function of input signal amplitude, according to another embodiment of the present invention.

In FIG. 11, drive and bias signals of an embodiment an auxiliary amplifier of a Doherty amplifier arrangement according to the present invention are illustrated. It can thus be noted that even by keeping the drive signal essentially linear, a bias signal according to the figure can give the requested output signal behavior. The low-order drive signal results in a bandwidth essentially equal to the input signal bandwidth. In an amplitude range 14, the output signal is essentially zero. This is achieved by reducing the bias level considerably. The bias signal is kept below the amplitude-averaged bias signal level 10 in the amplitude range 12, and is allowed to increase in the amplitude range 11 to give an almost linear rise of the output signal for larger amplitudes.

The signals according to FIG. 11 can for instance deliver 18% more radio frequency current during the peaks, compared to a typical pre-distorted class B arrangement, due to the use of class A biasing in this end. Furthermore, a pre-distorted class B arrangement has a very abrupt onset of the drive signal, which causes a wide spectral bandwidth.

It is thus immediately realized that the principles according to the present invention can be used on a wide variety of systems. Different single amplifier elements having different characteristics can be used, and the amplifiers can also be used in more elaborate amplifier arrangements. Non-exclusive examples are Doherty amplifier arrangements, Chireix amplifier arrangements and amplifier arrangements using envelope elimination and restoration techniques.

Other non-linear current functions can also be generated with the proposed methods. Generally, maximum output power and efficiency can be improved compared to the other systems, but in case large phase variations with amplitude are to be incorporated, large reductions in drive signal bandwidth might not be feasible.

The dynamic bias used in the present invention gives generally an overcompensation of gain, i.e. the gain generally increases for higher amplitudes. In the embodiments described above, pre-distortion has been used to compensate this gain variation caused by the dynamic bias. A similar result can also be achieved by instead using feedback arrangements to modify the input signal into a drive signal. The feedback arrangements as such are known in prior art and are not further described.

The invention disclosed herein makes it possible to get the maximum output power, or output current, from a practical radio frequency transistor, with high efficiency and good linearity. The system improves output power and efficiency compared to a constant-gain dynamic biasing system, and improves useful bandwidth and output power compared to a pre-distorted class B amplifier. The improvements are fairly inexpensive. Increased bandwidth for the bias signal is the main complication, and for this a higher efficiency, more output power and reduced and partitioned D/A-converter bandwidth are achieved. The same ideas that are used for making efficient linear amplifiers can also be used for the nonlinear "peaking" amplifier in a Doherty amplifier system, as well as for creating other more or less non-linear current functions required in amplifier systems.

The system can be made more robust than prior art systems, since the possibility of achieving significantly more output power with retained or increased efficiency facilitates the inclusion of margins for circuit errors. The reduced generation of harmonics in the high-power end also lessens the requirements for repeatable circuit characteristics at the harmonic frequencies, which increases the production yield.

It will be understood by those skilled in the art that various modifications and changes may be made to the present invention without departure from the scope thereof, which is defined by the appended claims.

REFERENCES

[1] "RF Power Amplifiers for Wireless Communications" by S. C. Cripps, Artech House, Boston, 1999, pp. 45-60.

[2] "Output Performance of Idealized Microwave Power Amplifiers" by L. J. Kushner, Microwave Journal, Oct. 1989, pp. 103-116.

[3] "Low dissipation power and high linearity PCS power amplifier with adaptive gate bias control circuit" by K.-J. Youn et al., Electronics Letters, Vol. 32, No. 17, 15 Aug. 1996, pp. 1533-1535.

[4] "42% High-Efficiency Two-Stage HBT Power-Amplifier MMIC for W-CDMA Cellular Phone Systems" by T. Iwai et. al., IEEE Trans. MTT, Vol. 48, No. 12, December 2000, pp. 2567-2572.

[5] U.S. Pat. No. 5,923,215.

[6] U.S. Pat. No. 6,028,477.

[7] U.S. Pat. No. 5,808,511.

[8] "Improving the Power-Added Efficiency of FET Amplifiers Operating with Varying-Envelope Signals", IEEE Trans. MTT, Vol. 31, No. 1, January 1983, pp. 51-56.

[9] "A Thorough Investigation of Dynamic Bias on Linear GaAs FET Power Amplifier Performance" by T. H. Miers, V. A. Hirsch, 1992 IEEE MTT-S Digest, pp. 537-540.

[10] "Increased Efficiency in QAM Power Amplifiers" by D. R. Conn, R. H. Hemmers, 1998 IEEE MTT-S Digest, pp. 1647-1650.

[11] "A Dynamic Efficient Bias Scheme Improves SSPA in Aeronautical Satellite Communication Systems" by I. K. Stubbs, IEEE Colloquium on 'Evolving Technologies for Small Earth Station Hardware', Digest No. 1995/037, IEEE, London, UK, 44 pp. p 5/1-8.

[12] "A New Adaptive Double Envelope Feedback (ADEF) Linearizer for Solid State Power Amplifiers", IEEE Trans. MTT, Vol. 43, No. 7, July 1995, pp. 1508-1515.

[13] U.S. Pat. No. 5,757,229.

[14] U.S. Pat. No. 6,130,579.

[15] European patent application 1 075 081.

The invention claimed is:

1. Method of providing a radio frequency output signal, comprising the steps of:
   determining an instantaneous size measure of an input signal, said size measure being an amplitude or therefrom derivable quantity;
   deriving a drive signal from said input signal;
   providing a bias signal, being dependent on said instantaneous size measure; and
   amplifying said drive signal using a bias level according to said bias signal into said radio frequency output signal;
   whereby said bias signal dependency on said instantaneous size measure gives rise to an increased nonlinearity in said amplifying step.

2. Method according to claim 1, whereby said bias signal gives an amplification according to one of class C and class B for instantaneous size measures within a first amplitude range, and said bias signal being higher than class B amplification for instantaneous size measures above said first amplitude range.

3. Method according to claim 2, whereby said bias signal is controlled to give essentially a class A bias level at maximum amplitude.

4. Method according to claim 1, whereby said bias signal providing step is controlled for producing a predetermined output characteristics, whereby a bias signal amplitude-averaged over an amplitude interval comprising all amplitudes in an entire amplitude range supported by said amplifying step above a first amplitude is higher than a bias signal amplitude-averaged over said entire amplitude range.

5. Method according to claim 1, wherein said deriving step comprises the step of modifying said input signal.

6. Method according to claim 5, wherein said deriving step comprises the step of pre-distorting said input signal dependent on said instantaneous size measure.

7. Method according to claim 5, wherein said deriving step comprises the step of modifying said input signal by a feedback arrangement.

8. Method according to claim 1, wherein said bias signal is controlled to, for all amplitudes within a first amplitude range, increase with increasing amplitude.

9. Method according to claim 1, wherein said bias signal is controlled to be, for all amplitudes within a second amplitude range, lower than said bias signal amplitude-averaged over said entire amplitude range.

10. Method according to claim 8, wherein said first amplitude range comprises maximum amplitude.

11. Method according to claim 6, comprising the further steps of:
   selecting a pre-distortion function having a predetermined bandwidth; and
   adapting bias signal according to said pre-distortion function.

12. Method according to claim 11, wherein said pre-distortion function contains predominantly low-order components.

13. Method according to claim 6, comprising the further steps of:
   selecting said bias signal according to predetermined relations; and
   adapting said pre-distortion function according to said bias signal.

14. Method according to claim 1, wherein said output characteristics, at least for a third amplitude range, is linear.

15. Method according to claim 14, wherein said output characteristics is substantially linear over the entire amplitude range.

16. Method according to claim 1, wherein said output characteristics comprises a substantially zero output signal within a fourth amplitude range.

17. Method according to claim 1, comprising the further steps of:
   determining a feedback signal of said radio frequency output signal; and
   adapting said drive signal and/or said bias signal according to said feedback signal.

18. Method according to claim 6, comprising the further steps of:
   causing said pre-distorting and bias signal providing steps to be simultaneous at the input of said amplification.

19. Method according to claim 18, wherein said causing step in turn comprises at least one of the steps of:
   inverse filtering of said drive signal with respect to a first signal path to an amplifying element;
   delay compensation of said drive signal with respect to said first signal path to an amplifying element;
   inverse filtering of said bias signal with respect to a second signal path to said amplifying element; and
   delay compensation of said bias signal with respect to said second signal path to said amplifying element.

20. Method according to claim 1, comprising the further step of:
compensating current saturation at high amplitude end.

21. Use of a method according to claim 1 in a radio frequency amplifier arrangement of a type selected from the list of:
Doherty amplifier arrangement;
Chireix amplifier arrangement; and
amplifier arrangements using envelope and restoration enhancement techniques.

22. Radio frequency power amplifier, comprising:
input signal terminal;
input detector arranged to determine an instantaneous size measure of a signal on said input signal terminal, said size measure being an amplitude or therefrom derivable quantity;
drive signal deriving means connected to said input signal terminal, providing a drive signal;
bias signal generator providing a bias signal, said bias signal generator being connected to said input detector and being controlled dependent on said instantaneous size measure; and
amplifying element, connected to said drive signal deriving means and said bias signal generator;
whereby said bias signal generator being controlled to gives rise to an increased nonlinearity in said amplifying element.

23. Radio frequency power amplifier according to claim 22, wherein said bias signal generator is arranged to give an amplification in said amplifying element according to one of class C and class B for instantaneous size measures within a first amplitude range, and to give a bias signal being higher than class B amplification for instantaneous size measures above said first amplitude range.

24. Radio frequency power amplifier according to claim 22, wherein said bias signal generator is arranged to give a bias signal amplitude-averaged over an amplitude interval comprising all amplitudes in an entire amplitude range supported by said amplifying element above a first amplitude is higher than a bias signal amplitude-averaged over said entire amplitude range.

25. Radio frequency power amplifier according to claim 22, wherein said drive signal deriving means comprises pre-distorting means connected to said input detector, being controlled dependent on said instantaneous size measure.

26. Radio frequency power amplifier according to claim 22, wherein said bias signal generator in turn comprises means giving a bias signal, which for all amplitudes within a first amplitude range, increase with increasing amplitude.

27. Radio frequency power amplifier according to claim 22, wherein said bias signal generator in turn comprises means giving a bias signal, which for all amplitudes within a second amplitude range, is lower than an amplitude-averaged bias signal.

28. Radio frequency power amplifier according to claim 25, further comprising:
feed-back arrangement, in turn comprising a feedback sensor monitoring said output of said amplifier element and adaptation means connected said bias signal generator and said pre-distortion means for providing said bias signal generator and said pre-distortion means with a feedback signal;
said bias signal generator and said pre-distortion means being arranged to adapt their actions according to said feedback signal.

29. Radio frequency power amplifier according to claim 22, further comprising:
simultaneousness-causing means for causing said drive signal and bias signal to be simultaneous at in input of said amplifying element.

30. Radio frequency power amplifier according to claim 29, wherein said coincidence causing means in turn comprises at least one of:
inverse filter connected between said pre-distortion means and said amplifying element, for compensating for a first signal path to said amplifying element; and
inverse filter connected between said bias signal generator and said amplifying element, for compensating for a second signal path to said amplifying element.

31. Composite radio frequency power amplifier, comprising at least one radio frequency power amplifier according to claim 22 as a sub-amplifier.

32. Composite radio frequency power amplifier according to claim 31, wherein said composite radio frequency power amplifier is selected from the list of:
Doherty amplifier arrangement;
Chireix amplifier arrangement; and
amplifier arrangements using envelope elimination and restoration techniques.

33. Transmitter, having a radio frequency power amplifier, said radio frequency power amplifier comprising:
input signal terminal;
input detector arranged to determine an instantaneous size measure of a signal on said input signal terminal, said size measure being an amplitude or therefrom derivable quantity;
drive signal deriving means connected to said input signal terminal, providing a drive signal;
bias signal generator providing a bias signal, said bias signal generator being connected to said input detector and being controlled dependent on said instantaneous size measure; and
amplifying element, connected to said drive signal deriving means and said bias signal generator;
whereby said bias signal generator being controlled to gives rise to an increased nonlinearity in said amplifying element.

34. Transmitter according to claim 33, wherein said bias signal generator is arranged to give an amplification in said amplifying element according to one of class C and class B for instantaneous size measures within a first amplitude range, and to give a bias signal being higher than class B amplification for instantaneous size measures above said first amplitude range.

35. Transmitter according to claim 33, wherein said bias signal amplitude-averaged over an amplitude interval comprising all amplitudes in an entire amplitude range supported by said amplifying element above a first amplitude is higher than a bias signal amplitude-averaged over said entire amplitude range.

36. Transmitter according to claim 33, wherein said drive signal deriving means comprises pre-distorting means connected to said input detector, being controlled dependent on said instantaneous size measure.

37. Transmitter according to claim 33, wherein said bias signal generator in turn comprises means giving a bias signal, which for all amplitudes within a first amplitude range, increase with increasing amplitude.

38. Transmitter according to claim 33, wherein said bias signal generator in turn comprises means giving a bias signal, which for all amplitudes within a second amplitude range, is lower than an amplitude-averaged bias signal.

39. Transmitter according to claim 38, wherein said second amplitude range covers at least half the amplitude distribution.

40. Transmitter according to claim 38, wherein said pre-distortion means comprises means for making said drive signal larger than said input signal at least in said second amplitude range.

41. Wireless communication system, having a radio frequency power amplifier, said radio frequency power amplifier comprising:
- input signal terminal;
- input detector arranged to determine an instantaneous size measure of a signal on said input signal terminal, said size measure being an amplitude or therefrom derivable quantity;
- drive signal deriving means connected to said input signal terminal, providing a drive signal;
- bias signal generator providing a bias signal, said bias signal generator being connected to said input detector and being controlled dependent on said instantaneous size measure; and
- amplifying element, connected to said drive signal deriving means and said bias signal generator;
- whereby said bias signal generator being controlled gives rise to an increased nonlinearity in said amplifying element.

42. Base station of a wireless communication system, having a radio frequency power amplifier, said radio frequency power amplifier comprising:
- input signal terminal;
- input detector arranged to determine an instantaneous size measure of a signal on said input signal terminal, said size measure being an amplitude or therefrom derivable quantity;
- drive signal deriving means connected to said input signal terminal, providing a drive signal;
- bias signal generator providing a bias signal, said bias signal generator being connected to said input detector and being controlled dependent on said instantaneous size measure; and
- amplifying element, connected to said drive signal deriving means and said bias signal generator;
- whereby said bias signal generator being controlled gives rise to an increased nonlinearity in said amplifying element.

43. Mobile unit of a wireless communication system, having a radio frequency power amplifier, said radio frequency power amplifier comprising:
- input signal terminal;
- input detector arranged to determine an instantaneous size measure of a signal on said input signal terminal, said size measure being an amplitude or therefrom derivable quantity;
- drive signal deriving means connected to said input signal terminal, providing a drive signal;
- bias signal generator providing a bias signal, said bias signal generator being connected to said input detector and being controlled dependent on said instantaneous size measure; and
- amplifying element, connected to said drive signal deriving means and said bias signal generator;
- whereby said bias signal generator being controlled gives rise to an increased nonlinearity in said amplifying element.

* * * * *